(12) United States Patent
Kimura et al.

(10) Patent No.: US 8,040,049 B2
(45) Date of Patent: Oct. 18, 2011

(54) ORGANIC EL ELEMENT AND METHOD FOR MANUFACTURING THEREOF

(75) Inventors: Syohei Kimura, Tokyo (JP); Koji Takeshita, Tokyo (JP); Takahisa Shimizu, Tokyo (JP)

(73) Assignee: Toppan Printing Co., Ltd. (JP)

(*) Notice: Subject to any disclaimer, the term of this patent is extended or adjusted under 35 U.S.C. 154(b) by 161 days.

(21) Appl. No.: 12/485,806

(22) Filed: Jun. 16, 2009

(65) Prior Publication Data

US 2010/0079064 A1    Apr. 1, 2010

(30) Foreign Application Priority Data

Sep. 29, 2008   (JP) ................... 2008-250858

(51) Int. Cl.
*H01L 51/52* (2006.01)
(52) U.S. Cl. ........................ 313/504; 428/690
(58) Field of Classification Search .............. 313/504, 313/506; 445/24; 428/690
See application file for complete search history.

(56) References Cited

U.S. PATENT DOCUMENTS

| | | | | |
|---|---|---|---|---|
| 7,485,023 | B2* | 2/2009 | Takeshita et al. | 445/23 |
| 7,682,210 | B2* | 3/2010 | Kitazume | 445/24 |
| 7,786,667 | B2* | 8/2010 | Yamakawa et al. | 313/504 |
| 2007/0241665 | A1* | 10/2007 | Sakanoue et al. | 313/503 |
| 2008/0124574 | A1* | 5/2008 | Shoda et al. | 428/690 |
| 2008/0157657 | A1* | 7/2008 | Matsunami et al. | 313/504 |
| 2008/0231179 | A1* | 9/2008 | Abe et al. | 313/504 |
| 2009/0128014 | A1* | 5/2009 | Kitazume | 313/504 |

FOREIGN PATENT DOCUMENTS

| | | |
|---|---|---|
| JP | 10-012377 | 1/1998 |
| JP | 2001-093668 | 4/2001 |
| JP | 2001-155858 | 6/2001 |
| JP | 2002-305077 | 10/2002 |
| JP | 2006-073222 | 3/2006 |

* cited by examiner

*Primary Examiner* — Nimeshkumar Patel
*Assistant Examiner* — Mary Ellen Bowman
(74) *Attorney, Agent, or Firm* — Squire, Sanders & Dempsey (US) LLP

(57) ABSTRACT

One embodiment of the present invention is a method for manufacturing an organic electroluminescence element wherein the organic electroluminescence has a substrate, a partition wall on the substrate, a pixel on the substrate sectioned by the partition wall, an organic luminescent layer on the pixel, forming an under-layer on the entire surface of a luminescent area including the inside surface of the pixel and the upper surface of the partition wall and forming the organic luminescent layer by coating an ink which includes an organic luminous material by a printing method on the surface of the under-layer.

8 Claims, 3 Drawing Sheets though is superior in terms of accuracy of a pattern formation and evenness of film thickness. Thereby, relief printing is suitable for a method for manufacturing an organic electroluminescence element performed by a printing method.

ORGANIC EL ELEMENT AND METHOD FOR MANUFACTURING THEREOF

CROSS REFERENCE TO RELATED APPLICATION

This application is based on and claims the benefit of priority from the Japanese Patent Application number 2008-250858, filed on Sep. 29, 2008; the entire contents of which are incorporated herein by reference.

BACKGROUND OF THE INVENTION

1. Field of the Invention

The present invention relates to an organic electroluminescence (EL) element, a display having a high definition and a method for manufacturing thereof. In particular, the present invention relates to a method for manufacturing a display having a high definition by printing an ink material on a product to be printed such as a substrate for manufacturing precision parts so as to form a pattern by a printing method.

2. Description of the Related Art

Generally, an organic EL element has an organic luminescent layer having an organic luminous material between two electrode substrates facing each other. By applying a voltage to an organic luminescent layer, an organic EL element emits light. In order to emit light efficiently, it is important to control the thickness of the organic luminescent layer. For example, it is necessary to make a thin film with a thickness of about 100 nm. Moreover, patterning with a high definition is required when a display is manufactured.

As an organic luminous material which is formed on a substrate or the like, a low-molecular material and a high-molecular material can be used. In general, the thin film of a low-molecular material can be formed by a resistance heating deposition method (a vacuum evaporation method) or the like on a substrate, and is patterned using a mask with a fine pattern at this time. However, there is a problem that the larger a substrate becomes, the more difficult it is to obtain a patterning accuracy in this method.

On the other hand, as a process of pattering an organic luminescent layer in order to manufacture a full colored display using a high-molecular luminous material, a method for forming a pattern by an ink jet method and a method for forming a pattern using a printing plate are proposed.

The method for forming a pattern by an ink jet method includes discharging a luminescent layer material which was dissolved in a solvent on a substrate from an ink jet nozzle. Then, a predetermined pattern is obtained by drying the material on the substrate. (Patent Document 1) However, an ink spreads in a circular state at the time of dropping on a substrate, because an ink droplet discharged from the nozzle is spherical. Therefore, there is a problem in that a linear pattern cannot be obtained, because the shape of the formed pattern lacks linearity or the accuracy of the point where the ink droplet is dropped is poor.

On the other hand, for example, a method for forming a linear pattern by the following processes is disclosed (Patent Document 2): a bank is formed on a substrate using a material having an ink-repellent property by a photolithography method or the like; thereafter, an ink droplet is dropped on the substrate and the ink is repelled on the bank portion and a linear pattern is formed. However, when the ink repelled on the bank portion returns inside a pixel, the ink builds up in the pixel. Thereby there remains a problem in that irregularity of film thickness of an organic luminescent layer inside a pixel occurs.

Then, instead of a low-molecular material, patterning by a printing method using an ink which was made by a high-molecular organic material dissolved or dispersed in a solvent, is proposed. As a printing method, a relief printing method, a reverse type printing method or a screen printing method can be exemplified. Especially, relief printing is superior in terms of accuracy of a pattern formation and evenness of film thickness. Thereby, relief printing is suitable for a method for manufacturing an organic electroluminescence element performed by a printing method.

Furthermore, a method such as a gravure printing method in which a hard plate such as a printing plate made of a metal or the like is used is inappropriate among various printing methods, because an organic EL element and a display uses a glass substrate as a substrate in many cases. Therefore, a printing method which uses a printing plate made of rubber having elasticity, an offset printing method which uses a printing blanket made of rubber or a relief printing method which uses a photosensitive resin plate including rubber which has elasticity or including another resist as a main component can be adopted as an appropriate printing method. In an actual case, as an approach of these printing methods, a method for printing a pattern by an offset printing method and a method for printing a pattern by a relief printing method are proposed. (Patent Documents 3 and 4)

However, a formation of an organic luminescent layer by a printing method is significantly influenced by wetting properties of the surface of an area on which the organic luminescent layer is formed. Therefore, in the case where a layer located just under the organic luminescent layer (the layer is defined as an under-layer) is formed only within a pixel on a partition wall substrate as in the past, there was a problem in that the thickness of an organic luminescent layer differed, because wetting properties of the upper surface of a partition wall which is not printed and located around pixels and wetting properties within a pixel were different.

The present invention is practiced to solve this problem. The purpose of the present invention is to provide a method for manufacturing an organic EL element without defect and irregularity by forming the film of the organic luminescent layer uniformly at the time of forming the film of an organic luminescent layer.

Patent Document 1: JP-A-H10-12377
Patent Document 2: JP-A-2002-305077
Patent Document 3: JP-A-2001-93668
Patent Document 4: JP-A-2001-155858

SUMMARY OF THE INVENTION

One embodiment of the present invention is a method for manufacturing an organic electroluminescence element wherein the organic electroluminescence has a substrate, a partition wall on the substrate, a pixel on the substrate sectioned by the partition wall, an organic luminescent layer on the pixel, forming an under-layer on the entire surface of a luminescent area including the inside surface of the pixel and the upper surface of said partition wall and forming the organic luminescent layer by coating an ink which includes an organic luminous material by a printing method on the surface of the under-layer.

1 . . . a substrate, 2 . . . an anode, 3 . . . a partition wall, 4 . . . a hole transport layer, 5 . . . an interlayer, 6 . . . an organic luminescent layer, 7 . . . a cathode, 8 . . . a sealing body, 8*a* . . . a sealing cap, 8*b* . . . an adhesive, 8*c* . . . a desiccant, 9 . . . a pixel part, 10 . . . a substrate on which a partition wall is formed (a substrate to be printed), 11 . . . a plate cylinder, 12 . . . a resin relief plate, 13 . . . an anilox roll, 14 . . . a stripe of a plate

DETAILED DESCRIPTION OF THE INVENTION

Figure 1:
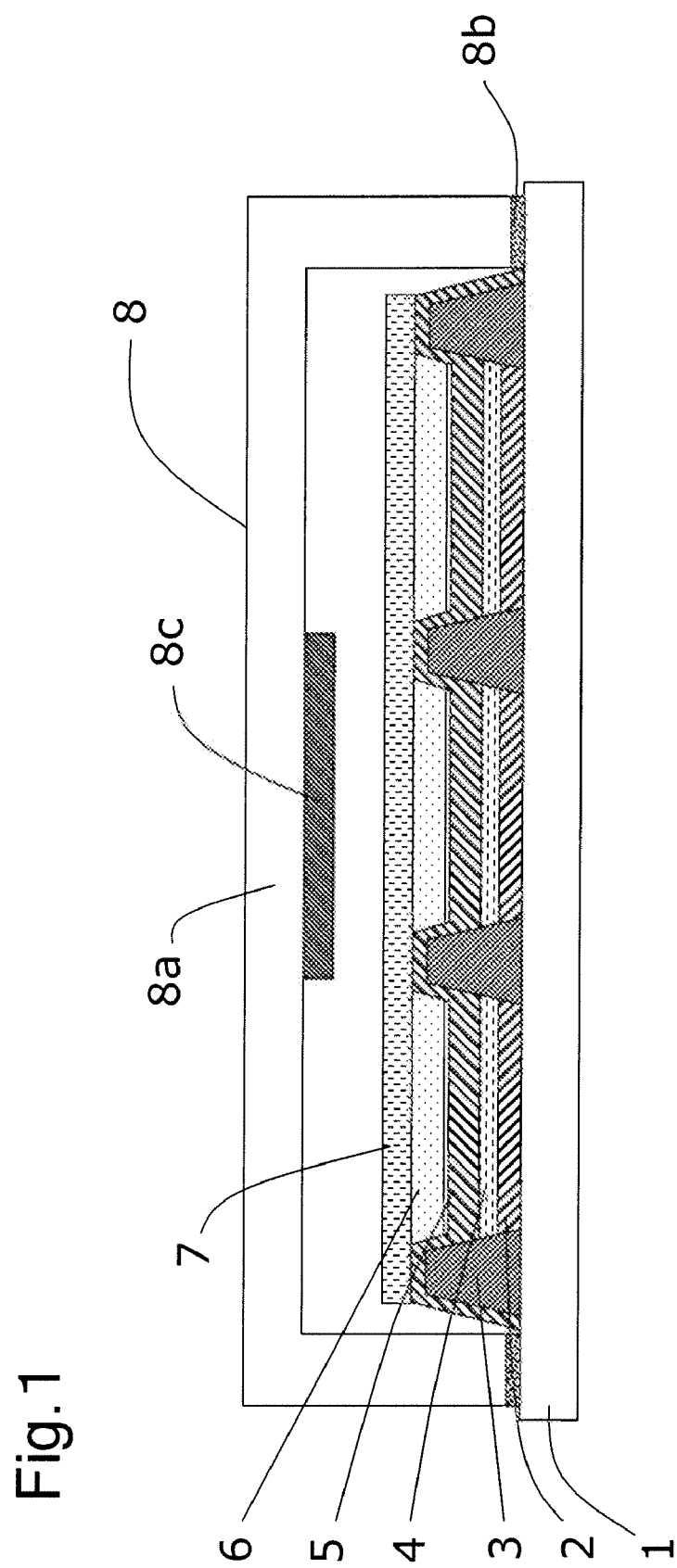
FIG. 1 is a cross-sectional pattern diagram of an organic EL element of the present invention.

FIG. 1 is a cross-sectional pattern diagram of an organic EL element of the present invention. An organic EL element in FIG. 1 has an anode 2, a hole transport layer 4, an interlayer 5, an organic luminescent layer 6 and a cathode 7 on a substrate 1. The organic luminescent layer 6 is arranged between the anode 2 and the cathode 7. The hole transport layer 4 and the interlayer 5 are arranged between the anode 2 and the organic luminescent layer 6. In addition, a partition wall 3 is arranged between the patterned anodes 2. The organic EL formations having the substrate 1 on which the anode 2, the partition wall 3, the hole transport layer 4, the interlayer 5, the organic luminescent layer 6 and the cathode 7 are arranged has a sealing body 8 in order to protect the electrodes or the organic luminescent layer from the external atmosphere. The sealing body 8 has a sealing cap 8*a*, an adhesive 8*b* and a desiccant 8*c*.

Moreover, an organic EL element of the present invention has a luminescent auxiliary layer between an anode and a cathode other than an organic luminescent layer. As a luminescent auxiliary layer, an electron injection layer, an electron transport layer or the like can be exemplified other than the hole transport layer and the interlayer shown in FIG. 1. The luminescent auxiliary layer is selected arbitrarily. However, plural luminescent auxiliary layers can also be selected. A hole transport layer and an interlayer are arranged between an anode and an organic luminescent layer. An electron injection layer and an electron transport layer are arranged between an organic luminescent layer and a cathode. Moreover, an anode, a cathode, an organic luminescent layer, a hole transport layer or an interlayer in an organic EL element of the present invention may have a single layer structure or a multilayer structure.

An interlayer which is arranged as a buffer layer between a hole transport layer and a luminescent layer is expected to have the effect of improving hole transport characteristics and blocking an electron coming from a cathode side. In actual fact, it is confirmed that efficiency and lifetime of an organic EL element are improved by arranging an interlayer.

Here, regardless of a layered structure of a luminescent auxiliary layer, a layer which is arranged just under the organic luminescent layer at the time of forming an organic luminescent layer is called an under-layer. The case in which an interlayer is used as an under-layer is explained below. However, the present invention can also be applied to other luminescent auxiliary layers, in particular the present invention can also be applied to a layer formed by a coating method.

According to the present invention, wetting properties of a partition wall and the inside surface of pixels can be uniform, because an under-layer is formed not only the inside surface of pixels, but also on the entire surface of an element including the surface of a partition wall. Therefore, evenness of the film thickness of an organic luminescent layer can be improved, because irregularity in the surface of an organic luminescent layer on a patterned part of a pixel can be decreased. Then, an organic EL element without irregularity in light-emitting can be obtained.

In addition, an organic EL element of the present invention can be applied to both an organic EL element of a passive matrix type and an organic EL element of an active matrix type. An organic EL element of a passive matrix type has a structure in which an anode and a cathode which are stripe shaped are facing so as to be perpendicular to each other and the point where they intersect emits light. On the other hand, an organic EL element of an active matrix type has a structure in which each pixel has a thin film transistor (TFT), in other words, each pixel emits light respectively by using a TFT substrate. In an organic EL element of an active matrix type, one electrode of either the anode or cathode is arranged within a pixel on a TFT substrate and the other electrode is arranged on all pixels.

Furthermore, an organic EL element of the present invention may be either of an organic EL element of a bottom emission type in which emitted light is taken out from a substrate side or an organic EL element of a top emission type in which emitted light is taken out from the opposite side of a substrate. In the case where the present invention is applied to an organic EL element of a bottom emission type, it is necessary for a substrate and an anode to have light transparency. When the present invention is applied to an organic EL element of a top emission type, a cathode and a sealing body are required to have light transparency.

Next, a method for manufacturing an organic EL element of the present invention shown in FIG. 1 is explained. However, the present invention is not limited to this.

As the substrate 1 in the present invention, any substrate can be used as long as it has insulating characteristics. When the present invention is applied to an organic EL element of a bottom emission type in which light is emitted from a substrate side, it is necessary to use a transparent product as a substrate.

For example, a glass substrate and a quartz substrate can be used as a transparent substrate. Moreover, a plastic film or sheet such as polypropylene, polyethersulfone, polycarbonate, cyclo olefin polymer, polyarylate, polyamide, polymethylmethacrylate, polyethylene terephthalate and polyethylene naphthalate can be used. In addition, a substrate where a thin film of metallic oxide, a thin film of metal fluoride, a thin film of metal nitrides, a thin film of metal oxynitride or polymer resin film is stacked on a plastic film or sheet can be used.

As the thin film of metallic oxide, silicium oxide, aluminum oxide or the like can be exemplified. As the thin film of metal fluoride, aluminum fluoride, magnesium fluoride or the like can be exemplified. As this thin film of metal nitrides, silicon nitride, aluminum nitride or the like can be exemplified. As the polymer resin film, acryl resin, epoxy resin, silicone resin, polyester resin or the like can be exemplified. In addition, an opaque substrate can also be used for an organic EL element of a top emission type.

Moreover, it is preferable that moisture absorbed on the surface of a substrate or within a substrate is decreased as much as possible by employing a heating process to the substrate beforehand. In addition, depending on the material stacked on a substrate, it is preferable to use a substrate on which a surface treatment such as ultrasonic cleaning processing, corona discharge treatment, plasma processing or ultra violet ozone treatment has been performed, in order to improve adhesiveness.

Furthermore, a driving substrate which has a thin film transistor (TFT) on the substrate can also be used. As a TFT material, poly thiophenes, poly aniline, copper phthalocyanine, perylene derivative or the like can be used. In addition, amorphous silicon or polysilicon can also be used. Moreover, a color filter layer, a light scattering layer, a light polarization layer or the like can be arranged on one side of the substrate.

Next, the anode 2 is arranged on the substrate 1. As a material for forming the anode, metal composite oxide such as ITO (indium tin oxide), IZO (indium zinc oxide) or zinc aluminum composite oxide can be used. As a method for forming a coated film, a dry coating method can be used. For example, a resistance heating deposition method, an electron-beam deposition method, a reactive deposition method, an ion plating method or a sputtering method. Moreover, after photoresist is applied to a metal oxide coated film which is formed in a vacuum condition, it is exposed and developed. Then, the coated film is fabricated so as to have a patterned shape by using a wet etching or a dry etching. In an organic EL element of a passive matrix type, an anode is formed into a stripe shape. In an organic EL element of an active matrix type, an anode is patterned in dots.

After the anode 2 is formed, the partition wall 3 is formed between the adjacent patterns of the anode, using a photosensitive material by a photolithographic method. More specifically, forming the partition wall includes at least a process of applying a photosensitive resist composition to a substrate and a process of forming the pattern of the partition wall by using pattern exposure, development and burning.

As a photosensitive material for forming the partition wall 3, either a positive type photoresist or negative type photoresist can be used and a commercially-marketed resist can be used. However, a resist is required to have insulating characteristics. When the partition wall does not have sufficient insulating characteristics, electrical current leaks into pixel electrodes adjacent to each other through the partition wall. Then, a defect occurs in the display. In addition, an appropriate display cannot be obtained because of TFT malfunction in some cases. As a photo sensitive material, specifically, polyimide system, acryl resin system, novolac resin system, fluorene series or the like can be exemplified. However, the present invention is not limited to these. Moreover, in order to improve a display quality of an organic EL display panel, a photosensitive material may include a material having light blocking properties.

A photosensitive resin for forming the partition wall 3 can be applied by a heretofore known coating method such as a spin coater, a bar coater, a roll coater, a die coater or a gravure coater. Next, in a process of forming the pattern of the partition wall by pattern exposure and development, the pattern of the partition wall part can be formed by a heretofore known exposure and development method. In addition, burning can be practiced by a heretofore known method using an oven, a hot plate or the like.

The thickness of the partition wall 3 is preferred to be 0.5-5.0 μm. By forming the partition wall 3 between the adjacent pixel electrodes, because a film of a hole transport ink which is applied to the upper surface of an electrode pattern becomes thin on the partition wall with leveling, a leak between adjacent pixels or the like does not easily occur and a short from the edge part of an anode can be prevented. Moreover, when organic luminous inks in which organic luminous materials which have different luminescent colors are dissolved or dispersed in solvents are separately applied to respective pixels, a mixed color of adjacent pixels can be prevented. When the partition wall is too low, care and attention are required, because an electrical current leaks through a hole transport layer between adjacent pixels, a short and a mixed color of organic luminous inks may not be prevented.

After the partition wall 3 is formed, a hole transport layer 4 is formed. When an organic material is used for a material for forming the hole transport layer 4, a material can be selected from a high-molecular hole transport material such as poly aniline, poly thiophenes, polyvinylcarbazole or a mixed material of poly (3,4-ethylenedioxy thiophene) and polystyrene sulfonic acid, or polythiopheneoligomer material. One of these materials may be dissolved or dispersed in a solvent and applied in one go using spin coating, projection coating or dip coating. In addition, when an inorganic material is used for a hole transport material, oxide, nitride and oxynitride of chrome (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn) and cadmium (Cd) can be formed as an inorganic material by using a vacuum evaporation method. By arranging a hole transport layer which includes an inorganic material, a more stable organic EL element which has excellent thermal stability and thermal tolerance can be obtained. In an organic EL element of the present invention, by arranging an under-layer, a luminescent layer having excellent uniformity without irregularity can be formed even when an inorganic material is used.

After the hole transport layer 4 is formed, the organic luminescent layer 6 is formed. The organic luminescent layer 6 emits light by applying an electrical current. As an organic luminous material for forming the organic luminescent layer 6, a material in which luminescent pigments such as coumarin, perylene, pyran, anthrone, porphyrin, quinacridone, N,N'-dialkyl substituted quinacridone, naphthalimide, N,N'-diaryl substituted pyrrolo pyrrole or iridium complex is dispersed in a high molecular such as polystyrene, polymethylmethacrylate and polyvinyl carbazole or a high molecular material such as poly arylene system, polyarylenevinylene system, polyphenylene vinylene or a poly fluorene system can be used.

Moreover, the interlayer 5 may be sandwiched between the organic luminescent layer 6 and the hole transport layer 4 of an organic EL element. The interlayer 5 increases adhesion of the organic luminescent layer to the hole transport layer 4 by heating. It is known that the luminescent efficiency of the organic luminescent layer 6 is improved by the interlayer 5 and driving lifetime becomes longer. As such a material, poly (2,7-(9,9-di-octyl fluorene))-alt-(1,4-phenylene-((4-sec-butylphenyl) imino)-1,4-phenylene)) (TFB) or the like can be exemplified.

In addition, when the interlayer 5 is formed, the interlayer 5 is also formed on the partition wall 3 in order to make wetting properties of the under-layer of the organic luminescent layer 6 uniform. At this time, if wetting properties of the upper surface of the partition wall is substantially the same as wetting properties of the interlayer 5, it is not necessary to form the interlayer 5 on the partition wall. Moreover, when the wetting properties are substantially the same, the ratio of the contact angle between the upper surface of the partition wall and a later described organic luminous ink and the contact angle between the upper surface of an under-layer and the later described organic luminous ink (the contact angle of the upper surface of a partition wall/the contact angle of the upper surface of an under-layer) is 0.9-1.1 or the difference between the contact angle of the upper surface of the partition wall and the contact angle of the upper surface of the under-layer is within 1°. Furthermore, the contact angle between the upper surface of the under-layer and the organic luminous ink and the contact angle between the upper surface of the partition wall and the organic luminous ink are preferred to be within 15° in order to obtain the excellent uniformity of an organic luminescent layer by making an organic luminous ink have leveling properties.

An organic luminous material is dissolved or stably dispersed in a solvent and made to be an organic luminous ink. As a solvent in which an organic luminous material is dissolved or dispersed, toluene, xylene, acetone, anisole, methyl ethyl ketone, methyl isobutyl ketone, cyclohexanone or the like can be used. The above mentioned solvents may be used alone, or may be used as a mixed solvent. Above all, an aromatic organic solvent such as toluene, xylene and anisole are preferable from an aspect of solubility of an organic luminous material. In addition, a surface active agent, an antioxidant, a viscosity modifier, and an ultraviolet absorber may be added to an organic luminous ink as necessary.

As a printing method for forming the interlayer 5 and the organic luminescent layer 6, a relief printing method is preferable in terms of its excellent accuracy in pattern formation and evenness of film thickness. A general coating method such as a spin coating method or a bar coating method can also be used, because patterning in a pixel part is not required for forming the interlayer 5. However, the coating method is not suitable for manufacturing an organic EL element because the usage efficiency of the material is low and film thickness is uneven. Moreover, a relief printing method is preferable in order not to cover a connection wiring portion or a part where a driver for driving is connected.

Figure 2:
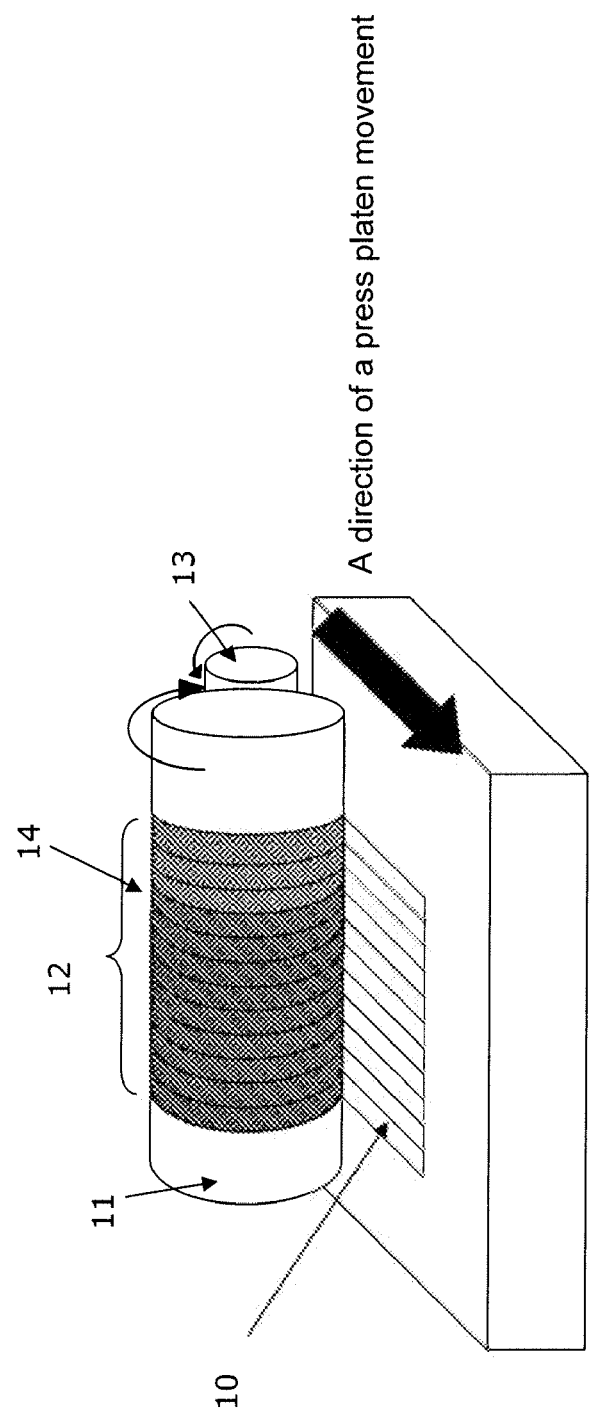
FIG. 2 is an explanatory diagram which explains a printing process of the present invention.

As a printing apparatus for forming an organic luminescent layer, any apparatus can be used as long as it is a relief printing apparatus which prints a material on a flat plate. However, the apparatus explained below is preferable. FIG. 2 shows a pattern diagram of a printing apparatus which is used for forming the interlayer 5 and the organic luminescent layer 6 of the present invention. A relief printing apparatus has an ink tank, an ink chamber, an anilox roll 13 and a plate cylinder 11 on which a resin relief plate 12 is arranged. A convex part of a resin relief plate can be formed by a photolithographic method, a laser ablation method or cutting. An ink tank has an organic luminous ink which is diluted with a solvent. The ink can be sent into the ink chamber from the ink tank. The anilox roll makes contact with an ink feed section of the ink chamber and the plate cylinder, and it is rotatably supported.

Along with a rotation of an anilox roll, after an organic luminous ink sent from an ink chamber is retained on the surface of the anilox roll uniformly, the ink is transferred to have a uniform thickness of a film on a convex part of a resin relief plate arranged on a plate cylinder. Furthermore, a substrate to be printed 10 (a TFT substrate) is fixed to a slidable substrate fixing base and moved to a printing start position, while a position adjustment is performed by a position adjustment mechanism of the pattern of the convex part of the resin relief plate and the pattern of the substrate to be printed. The substrate to be printed is then moved according to the rotation of the plate cylinder, while the convex part of the resin relief plate has contact with the substrate to be printed, and the organic luminous ink is transferred by patterning on the pre-determined positions (pixel lines) of the substrate to be printed which is arranged on a stage. At this time, a rolling direction of the plate cylinder and a stripe direction of the plate or a long direction of pixels may be parallel or perpendicular to each another.

Figure 3:
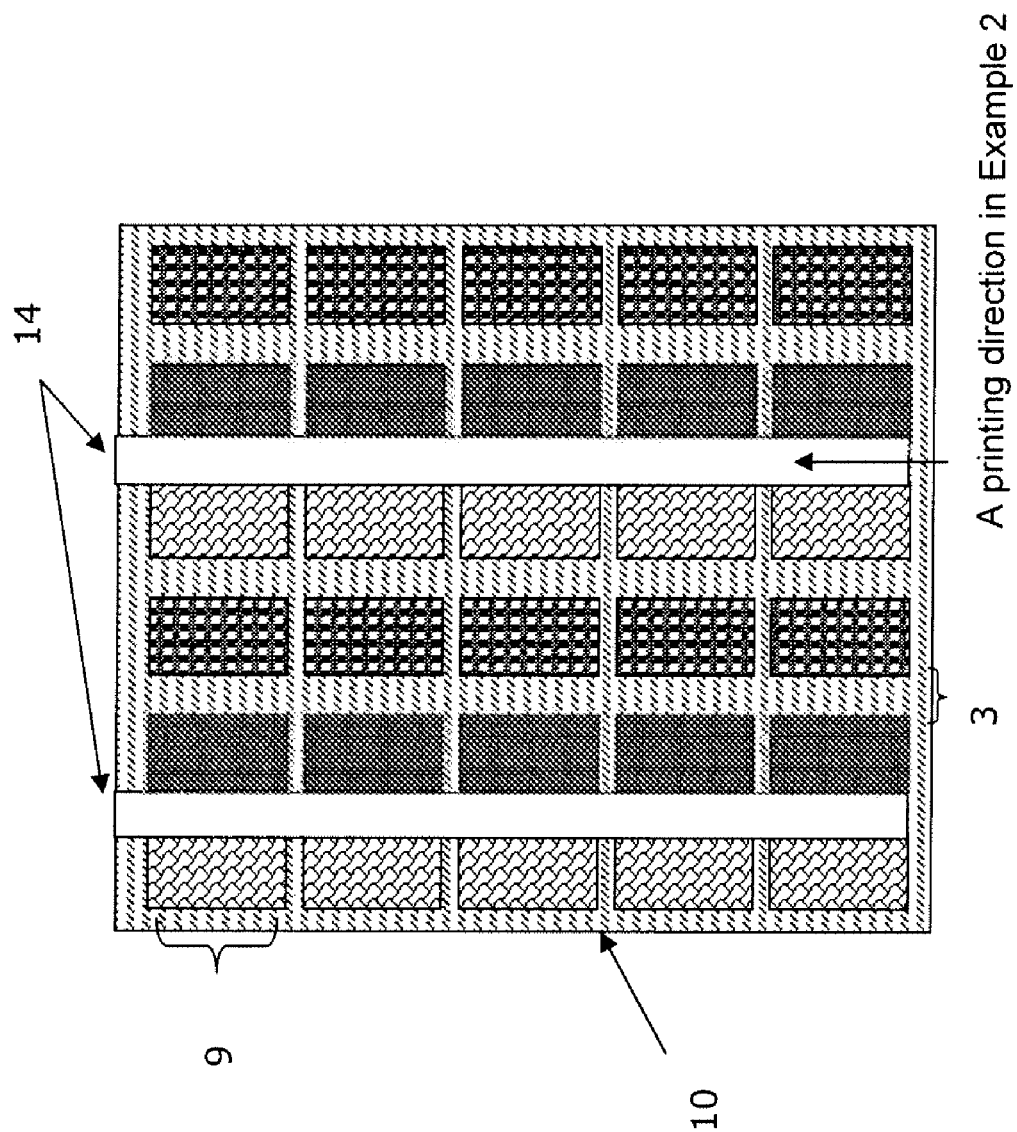
FIG. 3 is an explanatory diagram of a printing direction and an arrangement of pixel stripes of the present invention.

The difference between the interlayer 5 and the organic luminescent layer 6 is that the interlayer 5 is formed on the entire surface of a luminescent area including a partition wall. First, after a stripe shaped convex part of a resin relief plate corresponds to a line in which pixels are aligned, an interlayer is formed inside surface of a pixel. Next, after a stripe shaped convex part of a resin relief pate corresponds to the line of a partition wall between the pixel lines, an ink is transferred onto a substrate. (Refer to FIG. 3) Moreover, the order of these processes may be in tandem. By forming an organic layer on a pixel part and the upper surface of a partition wall separately in two stages by a printing method, an organic layer with a film having significantly excellent uniformity can be obtained, compared with a solid printing such as a roll coating method. In addition, an organic layer can be formed excluding an area such as a contact electrode portion of the edge part of an element, which is different from a method for applying to an entire surface such as a spin coater.

Moreover, when the shape of a pixel is rectangular which has a long side and a short side, printing in either direction is possible. When printing is performed while a stripe direction of a plate is parallel to a long side direction of a pixel, transferability is superior, because each pixel has a longer time in contact with a plate, compared with printing in a short side direction. Therefore, film uniformity is superior. On the other hand, when printing is performed while a stripe direction of a plate is parallel to a short side direction of a pixel, an interlayer can be printed on the whole area of RGB pixels in one go, even at the time of manufacturing a display with a higher definition, because a pitch of a stripe of a plate is larger. Specifically, printing in a short side direction is particularly effective for a display with equal to or more than 70 ppi definition. Although it depends on the characteristics of an ink, an interlayer can be printed in one go in a display with equal to or less than 200 ppi definition. An interlayer can be formed on the entire surface of a luminescent area including the inside surface of a pixel and the upper surface of a partition wall in this way.

Next, the cathode 7 is formed. As a material for the cathode layer 7, a substance which has a high efficiency of injecting electrons into the organic luminescent layer 6 is used. Specifically, a metal simple substance such as Mg, Al and Yb can be used. Moreover, stacked films including a film of Al or Cu which has a high stability and electric conductivity and about 1 nm of a film made of a compound of Li, lithium oxide, LiF or the like is in an interfacial surface of a luminescent medium layer can be used. Or in order to have balance in an electron injecting efficiency and stability, an alloy of one or more of metals such as Li, Mg, Ca, Sr, La, Ce, Er, Eu, Sc, Y or Yb which have a low work function and metal elements such as Ag, Al, or Cu which are stable can be used. In particular, an alloy of MgAg, AlLi, CuLi or the like can be used. When the cathode layer 7 is used as a light-transmitting electrode layer, after Li or Ca which has a low work function is formed into a thin film, a metal composite oxide such as ITO (indium tin oxide), indium zinc oxide or zinc aluminum composite oxide can be stacked. In addition, after metal such as Li or Ca which has a low work function is doped in the organic luminescent layer 6, metal oxide such as ITO can be stacked.

As a method for forming the cathode 7, a resistance heating deposition method, an electron beam method, a reactive evaporation method, an ion plating method or a sputtering method can be used. The thickness of the cathode is not limited particularly, but is preferred to be about 10-1000 nm. When the film thickness of the cathode is less than 10 nm, a pinhole of a film cannot be filled in sufficiently, which may cause a short. Moreover, when the film thickness is over 1000 nm, it takes a longer time to form a film and productivity is decreased. Furthermore, the cathode can be formed and patterned by using a mask at the time of forming a film.

Lastly, in order to protect these formations of an organic EL from external oxygen and moisture, these formations of an organic EL are sealed using a sealing body 8. As the sealing body 8, the sealing cap 8a and the substrate 1 are affixed through the adhesive 8b using the sealing cap 8a which has a concave portion. Moreover, a desiccant 8c can be added to an interspace which is sealed by the sealing cap 8a and the substrate 1.

As the sealing cap 8a, a metal cap or a glass cap can be used. As the adhesive 8b, a photocurable resin such as a radical system adhesive having a resin such as acrylates such as ester acrylates, urethane acrylates, epoxy acrylate, melamine acrylates or acrylic resin acrylates, or urethane polyester, a cation-based adhesive having a resin such as epoxy or vinyl ether, or a thiolene-added resin adhesive can be used. A thermosetting resin or an ultraviolet cure epoxy system adhesive can also be used. As the desiccant 8c, barium oxide or calcium oxide can be used.

In addition, other than the above, a barrier layer may be formed as a formation of an organic EL and the barrier layer can be a sealing body. At this time, as a barrier layer, silicon oxide, silicon nitride, silicon oxynitride or the like can be used. The above is formed so as to cover the entire surface of a formation of an organic EL by a vacuum film formation method such as a CVD method. Moreover, a barrier layer which is arranged in an organic EL element is affixed to a sealing substrate through an adhesive layer and a sealing body can also be formed in this way.

According to the present invention, an organic EL element without irregularity in light emitting can be manufactured, because irregularity in the surface of an organic luminescent layer within a pixel portion is decreased by forming an under-layer of a luminescent layer on the entire surface of a pixel portion and a partition wall and making wetting properties uniform. Furthermore, irregularity in the surface of a luminescent layer can be further decreased, because an under-layer with excellent surface uniformity can be formed by printing an under-layer on a stripe line including a pixel portion and a stripe of the upper surface of a partition wall separately in two stages.

EXAMPLE 1

Next, examples of the present invention are explained below. In the examples, a TFT substrate 1 having a pixel electrode (an anode 2), a connection electrode, an insulating layer including a film of SiNx which is for protecting a TFT circuit and an insulating layer having polyimide formed so as to section pixels, which means the insulating layer works also as a partition wall 7, is used. In addition, a hole transport layer 4, an organic luminescent layer 6 and a cathode 7 are formed on the substrate in this order and an organic EL display panel of an active matrix type is manufactured.

A hole transport layer 4 was formed by forming the film of molybdenum oxide so as to have a thin film of 40 nm on the TFT substrate 1 by a sputtering method. An interlayer 5 was printed with a printing point corresponding to a line of a partition wall after printing uniformly on a line of a pixel portion 9. Then, the interlayer 5 was printed on the entire surface of a luminescent area of the substrate by a relief printing method. An luminescent layer was formed by applying RGB separately to respective pixels by a relief printing method using organic luminous inks of three colors, that is Red, Green and Blue, made by dissolving a R material, a G material and a B material of polyfluorene system which is an organic luminous material in a printing solvent A so that a concentration of the inks becomes 2%.

At this time, a water developable photo-sensitive resin plate was used for printing a luminescent layer. A contact angel of a luminous material ink to the surface of the plate was less than 10°. The printing was performed parallel to a long side of a pixel, while a plate cylinder where a relief plate was wound, rolled in a stripe direction of a stripe shaped image forming part.

On the luminescent layer, a cathode 7 including Ba and Al was vacuum-evaporated and formed by a resistance heating deposition method. Lastly, these organic EL formations were sealed using a sealing cap 8a and an adhesive 8b in order to protect against external oxygen and moisture. Then, an element panel for an organic EL display could be obtained.

There were respective connection electrodes on both an anode side and a cathode side which were connected to respective pixel electrodes around the edge of a display area of the obtained panel. A lighted display of the panel was confirmed by connecting to a driving apparatus through these drivers. Thereafter, a luminescent state was examined. Uniformity of a film thickness within a pixel was excellent and the panel emitted light without irregularity.

COMPARATIVE EXAMPLE 1

In comparative example 1, an interlayer was formed only in a line of a pixel part 9 and was not printed on a partition wall. Then, an element panel for an organic EL display was obtained by the same method as shown in example 1 except the above.

In the panel obtained in comparative example 1, at the time of printing an organic luminous material, irregularity in the film thickness in a surface between pixels occurred. Also a panel emitted light irregularly.

Results of Comparison

Table 1 shows the results of the panel emission in example 1 and comparative example 1.

TABLE 1

| | Average of the entire film thickness | Irregularity in film thickness (3σ) | Uniformity of a surface (irregularity in light-emitting) |
|---|---|---|---|
| Example 1 | 71.4 nm | 8.5 nm | ○ |
| Comparative Example 1 | 75.7 nm | 15.3 nm | X |

When an interlayer material was printed only on a pixel on the TFT substrate as shown in comparative example 1, a film of molybdenum oxide which was formed on the entire surface as a hole transport material was on a partition wall. Then, the difference between wetting properties of an interlayer material and wetting properties of the surface of molybdenum oxide which were respectively on a pixel and a partition wall was studied.

First, an ink material for forming an interlayer was applied by a spin coating method using a glass substrate 40 centimeters square with a thickness of 0.7 mm as a substrate. Using the substrate, a contact angle between water and the film of an interlayer and a contact angle between a printing solvent A and the film of the interlayer were studied. In addition, the substrate was irradiated with ultraviolet rays for three minutes using UV/O$_3$ cleaning apparatus manufactured by ORC MANUFACTURING CO. LTD. before an ink material for forming an interlayer was applied to the substrate. After applying the ink material, the substrate was immediately transferred to a hot plate of 200 degrees Celsius and baked for 15 minutes. At this time, the film thickness of the interlayer became about 20 nm after drying.

A film of molybdenum oxide was formed using the same glass substrate used for the film of the interlayer so as to have a thickness of 40 nm by a sputtering method. A contact angle between water and a film of molybdenum oxide and a contact angle between a printing solvent A and the film of molybdenum oxide were studied the same as the film of the interlayer.

Table 2 shows the results of the contact angles of the film of the interlayer and the film of molybdenum oxide.

TABLE 2

|  | Water (°) | A printing solvent A (°) |
| --- | --- | --- |
| An interlayer (a pixel) | 98.4 | 5.3 |
| Molybdenum oxide (a partition wall) | 32.8 | 17.4 |

According to the result, it was found that the film of the interlayer had a significantly high water-repellent property and had much superior wetting properties to a printing solvent A, compared with a film of molybdenum oxide. Moreover, because there was the difference in wetting properties to a printing solvent A, this indicates that at the time of printing an organic luminescent layer on an interlayer, printing an organic luminescent layer on the inside surface of a pixel lacks stability due to the difference between wetting properties of a pixel and a partition wall in comparative example 1.

According to the above, as an effect of the present invention, wetting properties of a partition wall and the inside surface of a pixel becomes uniform by printing an interlayer on the whole area of a pattern part of a partition wall substrate. Therefore, an organic EL element without irregularity in light-emitting can be manufactured by decreasing irregularity in the surface of an organic luminescent layer within a pixel pattern portion.

What is claimed is:

1. A method of manufacturing an organic electroluminescence element, said organic electroluminescence element comprising:
   a substrate;
   a partition wall on said substrate;
   a pixel on said substrate sectioned by said partition wall; and
   an organic luminescent layer on said pixel,
   said method comprising:
   forming an under-layer on an entire surface of a luminescent area including an inside surface of said pixel and an upper surface of said partition wall;
   and
   forming said organic luminescent layer by coating an ink including an organic luminous material on a surface of said under-layer by a relief printing method,
   wherein forming said under-layer comprises
      printing said under-layer in a stripe pattern on a line including said pixel
      and
      printing said under-layer in a stripe pattern on said partition wall, in tandem.

2. The method for manufacturing an organic electroluminescence element according to claim 1, wherein a contact angle between said under-layer and said ink is equal to or less than 15°.

3. The method for manufacturing an organic electroluminescence element according to claim 1, wherein said under-layer is formed on a surface of a hole transport layer and said hole transport layer includes a metal oxide.

4. The method for manufacturing an organic electroluminescence element according to claim 1, wherein said under-layer is formed by a relief printing method.

5. A method for manufacturing an organic electroluminescence element, said organic electroluminescence element comprising:
   a substrate;
   a partition wall on said substrate;
   a pixel on said substrate sectioned by said partition wall; and
   an organic luminescent layer on said pixel,
   said method comprising:
   forming an under-layer; and
   forming said organic luminescent layer on a surface of said under-layer using an ink including an organic luminous material,
   wherein wetting properties of the under-layer to said ink are substantially the same as wetting properties of said partition wall to said ink,
   and
   wherein forming said under-layer comprises
      printing said under-layer in a stripe pattern on a line including said pixel
      and
      printing said under-layer in a stripe pattern on said partition wall, in tandem.

6. The method for manufacturing an organic electroluminescence element according to claim 5, wherein both a contact angel between said under-layer and said ink and a contact angle between said partition wall and said ink are equal to or less than 15°.

7. A method of manufacturing an organic electroluminescence element, said organic electroluminescence element comprising:
   a substrate;
   a thin film transistor on said substrate;
   a partition wall on said substrate;
   a pixel on said substrate sectioned by said partition wall; and
   an organic luminescent layer on said pixel,
   said method comprising:
   forming an under-layer on an entire surface of a luminescent area including an inside surface of said pixel and an upper surface of said partition wall by a relief printing method;
   and
   forming said organic luminescent layer by coating an ink including an organic luminous material on a surface of said under-layer by a relief printing method,
   wherein said pixel has a rectangular shape which has a long side and a short side,
   wherein forming said under-layer includes printing in a direction parallel to a direction of said short side of said pixel.

8. The method for manufacturing an organic electroluminescence element according to claim 7,
   wherein forming said under-layer comprises
      printing said under-layer in a stripe pattern on a line including said pixel and
      printing said under-layer in a stripe pattern on said partition wall, in tandem.

* * * * *